(12) United States Patent
Hongo et al.

(10) Patent No.: US 6,366,765 B1
(45) Date of Patent: Apr. 2, 2002

(54) RECEIVER

(75) Inventors: Naoki Hongo; Tetsuhiko Miyatani; Kenzo Urabe; Zhou Changming, all of Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/276,712

(22) Filed: Mar. 26, 1999

(30) Foreign Application Priority Data

Mar. 30, 1998 (JP) .......................................... 10-083150
Mar. 24, 1999 (JP) .......................................... 11-079468

(51) Int. Cl.[7] ................................................. H04B 1/18
(52) U.S. Cl. ................................ 455/161.1; 455/164.1; 455/165.1; 455/168.1; 455/232.1; 455/242.2; 455/307
(58) Field of Search .............................. 455/142, 553, 455/161.1, 164.1, 165.1, 168.1, 176.1, 183.1, 188.1, 232.1, 242.1, 255, 307, 76, 138; 375/350

(56) References Cited

U.S. PATENT DOCUMENTS 5,630,218 A * 5/1997 Muto ........................ 455/226.2
5,668,837 A * 9/1997 Dent ........................... 375/316
5,715,282 A * 2/1998 Mansouri et al. ............ 375/350
5,983,081 A * 11/1999 Lehtinen ...................... 455/76
6,185,434 B1 * 2/2001 Hagstrom et al. ........... 455/552

FOREIGN PATENT DOCUMENTS

JP       10-41704       2/1998
JP       10-247861      9/1998

OTHER PUBLICATIONS

IEICE Transactions, vol. E79–A, No. 12, Sawahashi et al, "Low–Power Consuming . . . ", Dec. 12, 1996, pp. 2070–2077.
IEICE Transactions, Sawahashi et al, "Low Power Consumption Matched Filter . . . ", 1996, pp. 57–62.

* cited by examiner

Primary Examiner—Dwayne Bost
Assistant Examiner—Temica M. Davis
(74) Attorney, Agent, or Firm—Jacobson Holman, PLLC

(57) ABSTRACT

The present invention intends to provide a receiver which receives a signal by switching a plurality of communication systems, wherein a circuit scale is reduced to intend to the miniaturization of a device. The receiver converts a received signal to a base band signal by a local oscillation frequency based on the selected communication system by a mixer, limits a band by an LPF through which signals of all communication systems can pass, performs a band limitation based on the communication system by weighting with a tap coefficient based on the selected communication system to synthesis by a transversal filter, and demodulates a signal by a demodulation system based on the selected communication system by a demodulating unit.

10 Claims, 13 Drawing Sheets

RECEIVER

BACKGROUND OF THE INVENTION (i) Field of the Invention

The present invention relates to a receiver which is applicable to a plurality of mobile radio communication systems by one unit and which receives a signal while switching the communication system and, more particularly, to a receiver in which a circuit scale is reduced to intend the miniaturization of a device.

(ii) Description of the Related Art

As communication systems used for a mobile radio cellular system, for example, there are a time division multiple access (TDMA) system, a frequency division multiple access (FDMA) system, and code division multiple access (CDMA) system.

A receiver for such a plurality of communication systems (hereinbelow, simply referred to as a receiver) which has a function for receiving signals of the plurality of communication systems and can receive a signal by switching to one communication system arbitrarily selected will now be described.

A conventional receiver will now be explained with reference to FIG. 13. FIG. 13 shows a constructional block diagram of the conventional receiver.

As shown in FIG. 13, the conventional receiver comprises an antenna 1, a gain variable LNA (low noise amplifier) 2, an AGC (automatic gain control) control unit 6, a mixer 8, an LPF (low pass filter) bank 9', a switching circuit 10, an A/D converter 11, a demodulating unit 12', a control unit 13', and a variable oscillator 21.

The component elements of the conventional receiver will now be explained hereinbelow.

The antenna 1 is a receiving antenna.

The gain variable LNA 2 is an LNA (Low Noise Amplifier) which can control a gain.

The AGC control unit 6 controls the gain of the gain variable LNA 2 so that a received signal level in an output of the switching circuit 10, which will be described herein later, is set constant.

The variable oscillator 21 is a variable oscillator for outputting a signal having the same local frequency as a carrier frequency used in the communication system in accordance with a frequency control signal from the control unit 13' which will be described herein later.

The mixer 8 frequency converts an input signal to a base band signal by a local oscillation frequency supplied from the variable oscillator 21.

The low pass filter (LPF) bank 9' is a bank having LPFs 9-1 to 9-n through which signals of bands used in the communication systems can pass in accordance with the plurality of applicable communication systems.

The switching circuit 10 receives all of outputs from the LPFs 9-1 to 9-n and outputs only the output from the LPF 9 designated in accordance with a switching control signal to designate the LPF 9 to be used on the basis of the communication system selected by the control unit 13', which will be described herein later, to the post stage.

The A/D converter 11 converts the output from the selected LPF 9 to a digital signal.

The demodulating unit 12' has demodulating functions in the plurality of applicable communication systems and performs demodulation by selecting the demodulating function of the designated communication system in accordance with a demodulating unit control signal to designate the communication system outputted from the control unit 13' which will be explained hereinbelow.

The control unit 13' outputs the frequency control signal to designate the same local frequency as a carrier frequency used in the communication system to the variable oscillator 21 in accordance with the one communication system arbitrarily selected from the outside, outputs a switching control signal to switch the LPF 9 which is applicable to the communication system to the switching circuit 10, and further, generates the demodulating unit control signal to designate the communication system to the demodulating unit 12'.

The operation of the conventional receiver will now be described with reference to FIG. 13.

In the conventional receiver, the frequency control signal to designate the same local frequency as the carrier frequency used in the communication system is outputted to the variable oscillator 21 by the control unit 13' in accordance with the arbitrary communication system selectively inputted from among a plurality of applicable communication systems from the outside. A signal having the designated frequency is oscillated to the mixer 8 by the variable oscillator 21.

The switching control signal of the LPF 9 suitable to the selected communication system is outputted from the control unit 13' to the switching circuit 10. Further, the demodulating unit control signal to designate the demodulation system based on the selected communication system is outputted from the control unit 13' to the demodulating unit 12'.

A received signal received by the antenna 1 is amplified by the gain variable LNA 2 and the resultant signal is frequency converted to a base band signal by the mixer 8 by using a signal which is outputted from the variable oscillator 21 and which has the same local frequency as the carrier frequency used in the designated communication system. The resultant signal is fetched to all of the LPFs 9 in the LPF bank 9'. Only bands used in the communication systems are outputted from the LPFs 9.

In accordance with the communication system selected by the switching circuit 10, only the output from the LPF 9 designated by the control unit 13' is outputted to the A/D converter 11.

At that time, the signal passed through the switching circuit 10 is fetched to the AGC control unit 6 and the gain of the gain variable LNA 2 is controlled by the AGC control unit 6 so that the level of the signal is held constant.

The signal is converted to a digital signal by the A/D converter 11 and the resultant signal is demodulated by the demodulating unit 12' by the communication system selected in accordance with the demodulating unit control signal from the control unit 13'.

As a conventional technique in which a plurality of communication systems are properly used by using a plurality of band pass filters having different characteristics, for example, there are a "Frequency Band Switching Common Device" proposed in Japanese Patent Application Laid-Open No. 10-247861(1998) disclosed on Sep. 14, 1998 (Applicant: Kokusai Electric Co., Ltd., Inventor: Katsumi Tanaka et al.) and an "Antenna Common Device" proposed in Japanese Patent Application Laid-Open No. 10-41704 (1998) disclosed on Feb. 13, 1998 (Applicant: Goyo Electronics Co., Ltd., Inventor: Masahiro Shindo et al.).

Each of those conventional techniques relates to a cellular phone of such a dual mode that an analog system and a digital system share the same frequency band, in which a plurality of filters are used in a reception side.

In the above conventional receiver, however, it is necessary to individually prepare the LPF 9 every corresponding communication system, so that there is a problem that a circuit scale remarkably increases.

SUMMARY OF THE INVENTION

It is an object of the present invention to provide a receiver for switching a plurality of communication systems to receive a signal, in which a circuit scale is reduced to intend the miniaturization of a device.

According to the present invention, there is provided a receiver which can be applicable to a plurality of communication systems and which receives a signal by the communication system arbitrarily selected from among the plurality of communication systems, comprising converting means for converting a received signal to a base band signal by a local oscillation frequency based on the selected communication system, setting means for setting a peculiar tap coefficients based on the selected communication system, and synthesizing means for weighting the base band signal with the set tap coefficients to synthesize them, and demodulating means for the signal synthesized by weighting by a demodulation system based on the selected communication system. Since it can be applicable to the plurality of communication systems without providing a band pass filter every communication system, a circuit scale can be reduced.

According to the present invention, there is provided a receiver which can be applicable to a plurality of communication systems and which receives a signal by the communication system arbitrarily selected from among the plurality of communication systems, comprising a variable oscillator for oscillating a local oscillation frequency based on the selected communication system, a mixer for converting a received signal to a base band signal by the local oscillation frequency, a transversal filter for setting a tap coefficient from information of tap coefficient inputted from the outside based on the selected communication system, and weighting the base band signal with the tap coefficient to synthesize them, thereby performing a band limitation based on the communication system to the resultant signal, and a demodulating unit for demodulating the signal by a demodulation system based on the selected communication system. Since it can be applicable to the plurality of communication systems without providing a band pass filter every communication system, a circuit scale can be reduced.

According to the present invention, there is provided a receiver which can be applicable to a plurality of outside communication systems and which receives a signal by the communication system arbitrarily selected from among the is plurality of communication systems, comprising a receiving antenna, a gain variable LNA for amplifying a signal from the receiving antenna by a gain control signal inputted from the outside, a mixer for converting a frequency of an output of the gain variable LNA to a base band frequency band by using a signal having a local frequency inputted from the outside, a variable oscillator for supplying a signal having the local frequency designated from the outside communication system to the mixer, an LPF, which has a band through which a signal having the widest band among the plurality of communication systems can pass, for limiting a band of the signal that is frequency converted by the mixer, an AGC control unit for deciding a gain of the gain variable LNA from the output of the LPF and generating a gain control signal to the gain variable LNA, a transversal filter for setting a tap coefficient from information of the tap coefficient inputted from the outside on the basis of the selected communication system and performing a band limitation suitable to the demodulation system based on the communication system by weighting the output of the LPF with the tap coefficient for synthesis, a demodulating unit for receiving the band-limited signal outputted from the transversal filter and performing demodulation based on the selected communication system to the signal, and a control unit for designating a local frequency of the variable oscillator on the basis of the selected communication system, outputting information of the tap coefficient having a fixed length that is equal to the maximum number of taps in the plurality of communication systems to the transversal filter so as to enable to be applicable to all of the plurality of communication systems, and designating a demodulation system to the demodulating unit. Since it can be applicable to the plurality of communication systems without providing a band pass filter every communication system, a circuit scale can be reduced.

The transversal filter according to the present invention suitably comprises sample holding means for sampling outputs of the LPF and holding a plurality of sampling values, delay means for subsequently shifting the information of tap coefficients supplied from the outside to hold them and for outputting the held information as a tap coefficient while shifting the information, synthesizing means for obtaining the sum of products obtained by multiplying the tap coefficients outputted from the delay means by sampling values outputted from the sample holding means and then outputting the sum, and timing control means for performing timing control in the sample holding means and the delay means.

The sample holding means of the transversal filter is means having sample holding circuits of the same number as that of predetermined sampling values and a first switch for sequentially sorting the outputs from the LPF to the sample holding circuit. As sample holding circuits, a sample holding circuit comprising a pair of second and third switches which are connected in series and which perform opening and closing operations for a clock signal so as to be contrary to each other, a capacitor for holding output signals of the switches, and a buffer for temporarily holding an input signal and signals held by the capacitor, sampling analog signals sorted and supplied by the first switch by the switching operations of the second and third switches, holding, and then outputting the signals is suitably used. The sample holding circuit can sample and hold input signals by a simple construction using switches, capacitor, and buffer and the switching operations of the switches.

The delay means of the transversal filter has serially connected delay elements of the same number as that of the sampling value. Each delay element holds information of the inputted tap coefficient. The delay means for simultaneously outputting digital values held in the delay elements as tap coefficients synchronously with a clock timing while shifting each value by an amount as much as one delay element is suitably used. The delay means can output the tap coefficients by a simple construction using the delay elements.

The synthesizing means of the transversal filter is synthesizing means having multiplying circuits of the same number as that of sampling values and an adding circuit for adding outputs from the multiplying circuits. As a multiplying circuit, a multiplying circuit having impedances which are connected in parallel and to which the inputted sampling value is dividedly supplied, switches each of which is connected to each impedance in series and which opens or closes by a value of each bit constructing the inputted tap coefficient, an amplifier to which outputs from the switches are supplied, and a feedback impedance for feeding back an output of the amplifier is suitably used. The synthesizing means can weight the sampling value with the tap coefficient to synthesize them by a simple construction using the impedances, switches, and feedback amplifier.

According to the present invention, there is provided a receiver having an A/D converter for converting an output from the transversal filter to a digital signal and a program section for realizing functions of the demodulating unit and control unit by using software in place of the above units. Since it can be applicable to a plurality of communication systems without having a band pass filter every communication system, a circuit scale can be reduced.

DESCRIPTION OF REFERENCE NUMERALS

Figure 1:
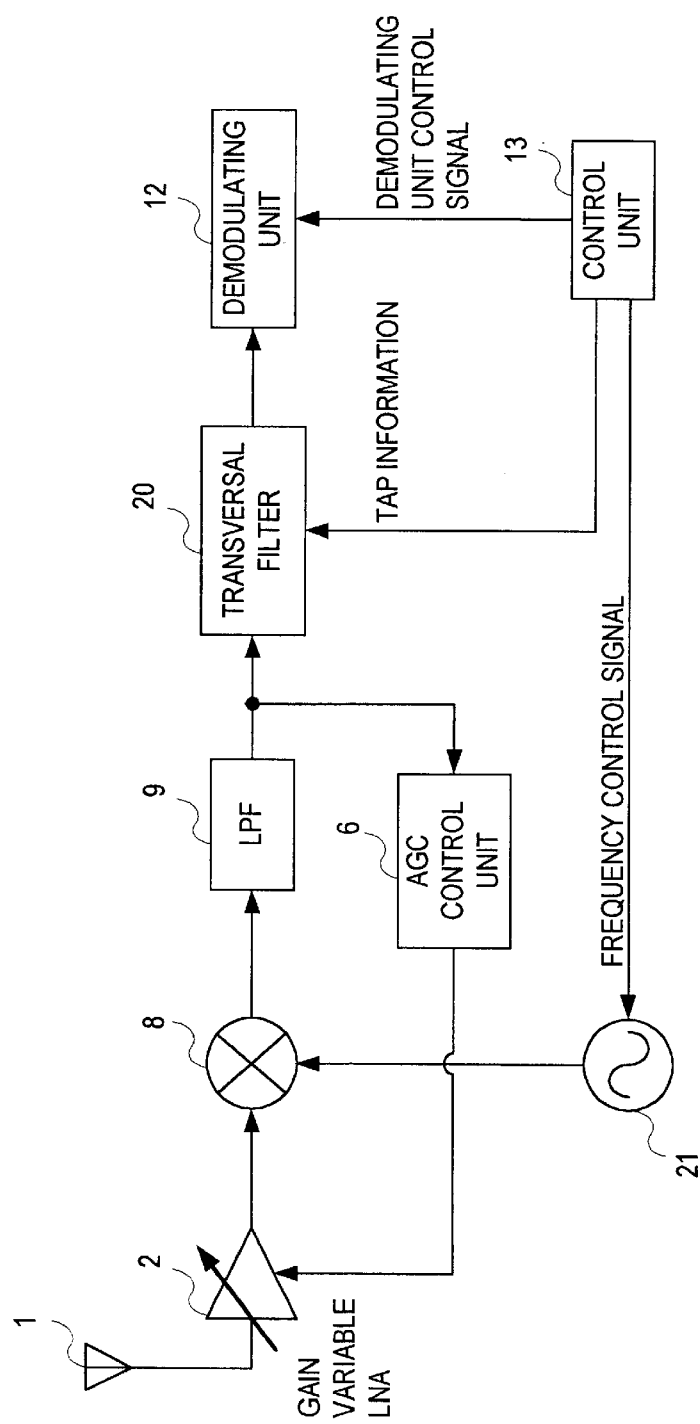
FIG. 1 is a constructional block diagram of a receiver according to an embodiment of the present invention.

1 . . . antenna, 2 . . . gain variable LNA, 6 . . . AGC control unit, 8 . . . mixer, 9 . . . LPF, 9'. . . LPF bank, 10 . . . switching circuit, 11 . . . A/D converter, 12, 12'. . . demodulating unit, 13, 13'. . . control unit, 19 . . . software section, 20 . . . transversal filter, 21 . . . variable oscillator, 30 . . . analog sample holding distributing circuit, 40 . . . delay circuit, 50 . . . weighted synthetic circuit, 60 . . . timing control unit, 300 . . . sample holding circuit, 310 . . . switch, 301, 304, 307 . . . input buffer, 302, 305 . . . switch, 303, 306 . . . capacitor, 400 . . . delay element, 500 . . . multiplying circuit, 501 . . . impedance, 502 . . . switch, 503 . . . amplifier, 504 . . . feedback impedance, 510 . . . adding circuit

DESCRIPTION OF THE PREFERRED EMBODIMENT

A receiver according to an embodiment of the present invention will now be described with reference to the drawings.

As function realizing means which will be explained hereinbelow, any circuit or device can be used so long as the means realizes the relevant functions. One part or all of functions can be also realized by software. Further, the function realizing means can be also realized by a plurality of circuits. The plurality of function realizing means can be realized by a single circuit.

A receiver according to the embodiment of the present invention is a receiver which can be applicable to a plurality of communication systems and which receives a signal by the communication system arbitrarily selected from among the communication systems. In the receiver, a received signal is converted to a base band signal by converting means by using a local oscillation frequency based on the selected communication system, a peculiar tap coefficient is set on the basis of the selected communication system by setting means, the base band signal is weighted with the set tap coefficient to synthesize them by synthesizing means, and the signal synthesized by weighting is demodulated by demodulating means by a demodulation system based on the selected communication system. Since it can be applicable to the plurality of communication systems without providing a band pass filter every communication system, the circuit scale can be reduced.

The converting means is realized by the following variable oscillator and mixer, the above-mentioned setting means and synthesizing means are realized by the following transversal filter, and the demodulating means is realized by the following demodulating unit.

The receiver according to the embodiment of the present invention which can be applicable to a plurality of communication systems and which receives a signal by the communication system arbitrarily selected from among the plurality of communication systems is a receiver comprising a variable oscillator for oscillating a local oscillation frequency based on the selected communication system, a mixer for converting a received signal to a base band signal by the local oscillation frequency, a transversal filter for setting a tap coefficient from information of tap coefficient inputted from the outside on the basis of the selected communication system, and weighting the base band signal with the tap coefficient to synthesize them, thereby performing a band limitation based on the communication system to the resultant signal, and a demodulating unit for demodulating the signal by a demodulation system based on the selected communication system. Since it can be applicable to the plurality of communication systems without providing a band pass filter every communication system, a circuit scale can be reduced.

It is also sufficient that between the mixer and the transversal filter, a band limitation filter (corresponding to the LPF 9 in FIG. 1) having a band through which a signal having the widest band in the plurality of communication systems can pass is arranged and the band of the signal whose frequency is converted by the mixer is limited and the resultant signal is outputted to the transversal filter.

In the receiver according to the embodiment of the present invention, the received signal is converted to the base band signal by the local oscillation frequency based on the selected communication system, the band is limited by the LPF through which the signals of all of the communication systems can pass, the band limitation based on the communication system is performed by weighting the signal with the tap coefficient based on the selected communication system for synthesis by the transversal filter, the signal is demodulated by the demodulation system based on the selected communication system by the demodulating unit, so that the receiver can be properly applicable to the plurality of communication systems without using an LPF every communication system, thereby enabling to reduce a circuit scale to intend the miniaturization of a device.

A construction of the receiver according to the embodiment of the invention will now be explained with reference to FIG. 1. FIG. 1 is a constructional block diagram of the receiver according to the embodiment of the present invention. Component elements having the same constructions as those in FIG. 13 will be explained by adding the same reference numerals.

The receiver ("the present receiver" or "a first receiver") according to the embodiment of the present invention comprises the antenna 1, gain variable LNA 2, AGC control unit 6, mixer 8, an LPF 9, a demodulating unit 12, a control unit 13, and variable oscillator 21 as the same component elements as those in the conventional receiver and further has a transversal filter 20 as a component element characteristics of the present invention.

A pass band in the LPF 9 and control contents in the control unit 13 are different from those in the conventional one.

Although sections of the present receiver will now be specifically explained, the explanation for the same portions as those in the conventional one is omitted.

The LPF 9 is a low pass filter (LPF) for allowing a base band frequency band obtained by the mixer 8 to pass, is a non-sampling system, and is a low pass filter comprising R: a resistor, L: a coil, C: a capacitor or an operation amplifier.

The LPF 9 is set so as to have a band for a signal having the widest band or more among the communication systems which can be selected by the receiver so that the present receiver can be applicable to all of the received communication systems.

Figure 2:
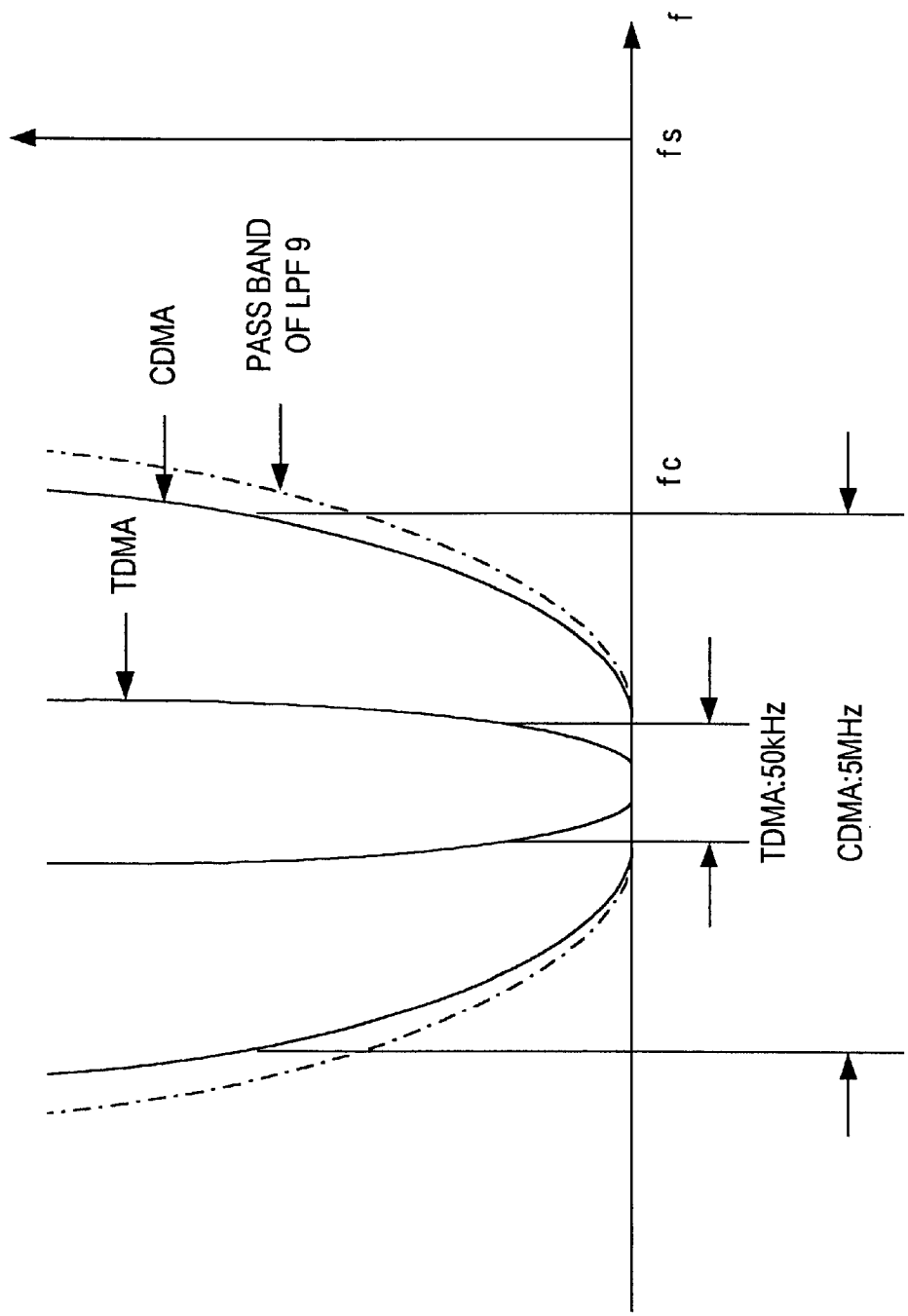
FIG. 2 is an explanatory graph of frequency spectra showing characteristics of received signals and situations of band limitations according to the embodiment of the present invention.

In this instance, a specific example with respect to the band limitation in the LPF of the present receiver will now be described with reference to FIG. 2. FIG. 2 is an explanatory diagram of frequency spectra showing characteristics of received signals and situations of the band limitation according to the embodiment of the present invention.

As examples of the plurality of applicable communication systems, cases of the two systems of the CDMA and the TDMA will now be explained.

As an example of the CDMA, a W-CDMA (wide band-CDMA; transmission speed: 4 Mcps, modulation system: QPSK, band width: 5 MHz) will be explained and, as an example of the TDMA, a PDC (personal digital communication system; transmission speed: 42 kbps, modulation system: QPSK, band width: 50 kHz) will be described.

In FIG. 2, the frequency spectrum of the CDMA, frequency spectrum of the TDMA, and a cut-off frequency fc of the LPF 9 are shown. Reference symbol fs in the diagram denotes a sampling rate of the transversal filter 20, which will be explained herein later.

In FIG. 2, a broken line denotes a pass band of the LPF 9. The pass band is adapted for a maximum receiving band width in the plurality of communication systems. For example, the cut-off frequency is set to 2.5 MHz so that the band width of 5 MHz in the CDMA can be passed.

The transversal filter 20 is a transversal filter having a function for performing the band limitation suitable to the demodulation system based on the selected communication system to an analog signal outputted from the LPF 9 and outputting the resultant signal to the demodulating unit 12. Information of the tap coefficient based on the selected communication system is inputted from the control unit 13 in a digital signal format.

A constructional example of the transversal filter 20 has been disclosed in detail in reference documents: Sawahashi, Adachi, Shou, and Zhou, "Low Power Consumption Matched Filter LSI for Wide Band DS-CDMA,"The Institute of Electronics, Information, and Communication Engineers(IEICE) of Japan, Society for Study of Radio Communication System, Technical Report of IEICE, RCS95-120 (1996–01), and Sawahashi, Adachi, Shou, and Zhou, "Low-Power Consuming Analog-Type Matched Filter for DS-CDMA Mobile Radio", IEICE Trans. Fundamentals, Vol.E79-A, No.12 December 1996.

In the document, an ADF (analog digital filter) which is used in the low power consumption matched filter LSI for the wide band DS-CDMA system uses an analog signal as an input/output signal. In the internal operation for the sum of products, the analog signal is controlled by a digital signal. The ADF corresponds to the transversal filter.

Since the transversal filter 20 is a transversal filter of the digital control in which the input/output is set by the analog signal and the tap coefficient is set by the digital signal, a channel selection filter which is optimized for the band of the input signal can be formed so long as the digital tap coefficient is changed. Therefore, the output of the transversal filter 20 is an output whose band is set to the narrowest band under conditions that a desired signal is not distorted and in which an S/N ratio (a signal power-to-noise power ratio) is maximum.

Details of the transversal filer 20 will be described herein later.

In a manner similar to the conventional control unit 13', the control unit 13 outputs a frequency control signal designated the same local frequency as a carrier frequency used in the communication system in accordance with the one communication system arbitrarily selected from the outside, outputs the demodulating unit control signal to designate the demodulation system based on the communication system, and as a characteristic portion of the control unit 13 of the present invention, outputs information (digital signal) of the tap coefficient based on the selected communication system to the transversal filter 20.

In this instance, the information of the tap coefficient based on the communication system is previously stored in a fixed length (n) in correspondence to the communication system having the maximum number of taps (n) among the number of taps necessary for the plurality of communication systems to which the present receiver can be applicable to In this instance, the information constructed in the fixed length (n) holds a value corresponding to the maximum number of taps (n). when the number of taps is smaller than n in the communication system, the information of the tap coefficient is stored so that information of such a tap coefficient as to make the tap coefficient of unnecessary digits invalid (to a value "0") may be outputted.

Consequently, the information of tap coefficient (tap information) of the fixed length (n) is outputted even when any communication system is selected.

Details of the information of tap coefficient to be outputted to the transversal filter 20 will be specifically explained in the description of the transversal filter 20.

Details of the transversal filter will now be described.

Figure 3:
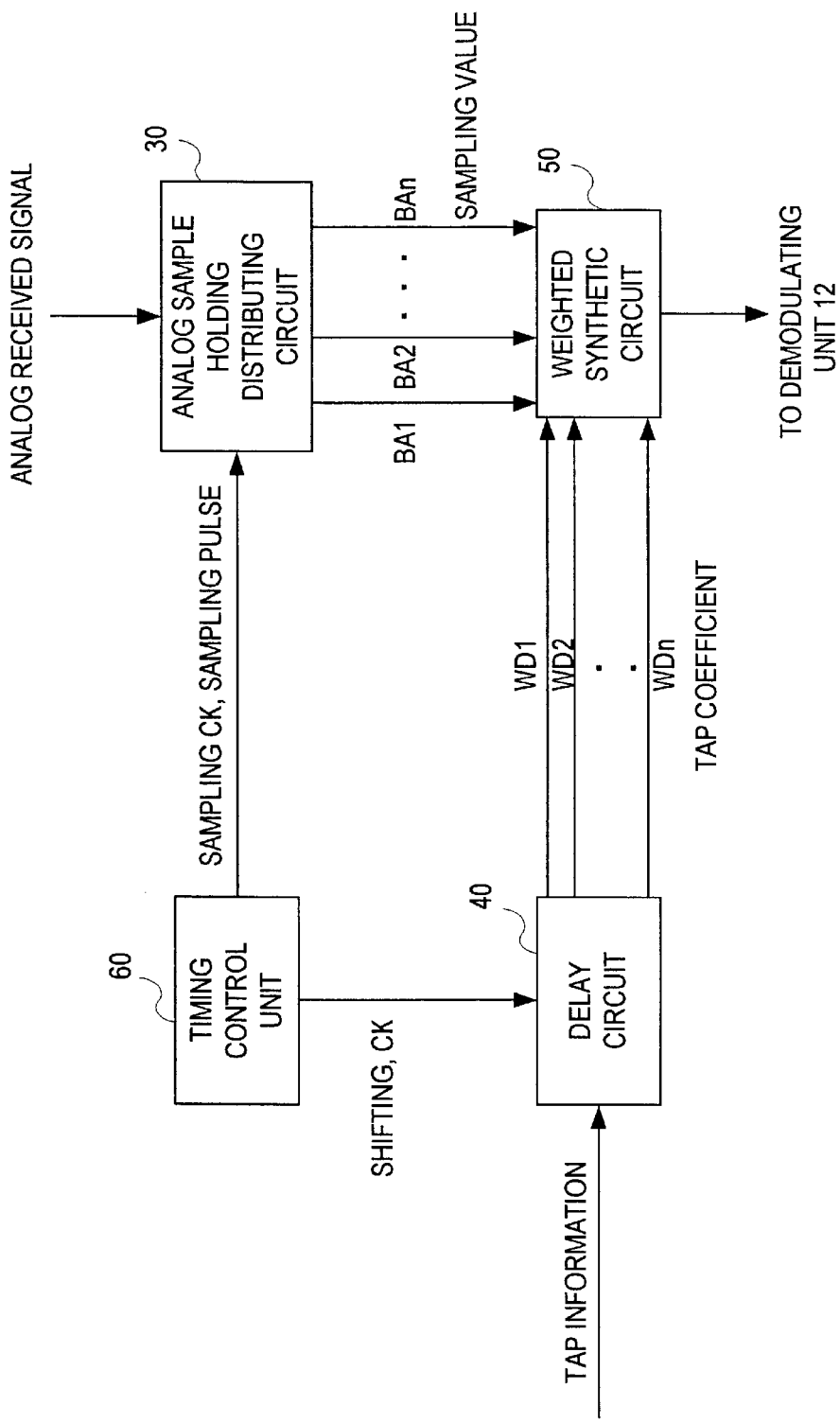
FIG. 3 is a schematic constructional block diagram of a transversal filter according to the embodiment of the present invention.

A schematic construction of the transversal filter of the present invention will now be described with reference to FIG. 3. FIG. 3 is a schematic constructional block diagram of the transversal filter of the present invention.

As shown in FIG. 3, the transversal filter 20 of the present invention comprises an analog sample holding distributing circuit 30 for sampling and holding reception base band signals each of whose band is limited to a wide band by the LPF 9 and outputting sampling values (BA1 to BAn), a delay circuit 40 for receiving tap information from the control unit 13 and outputting tap coefficients (WD1 to WDn), a weighted synthetic circuit 50 for outputting a demodulation signal synthesized by weighting the sampling value from the analog sample holding distributing circuit 30 with the tap coefficient from the delay circuit 40, and a timing control unit 60 for performing timing control in the analog sample holding distributing circuit 30 and delay circuit 40.

The analog sample holding distributing circuit 30 corresponds to sample holding means of the claims, the delay circuit 40 corresponds to delay means of the claims, the weighted synthetic circuit 50 corresponds to synthesizing means of the claims, and the timing control unit 60 corresponds to timing control means of the claims.

Figure 4:
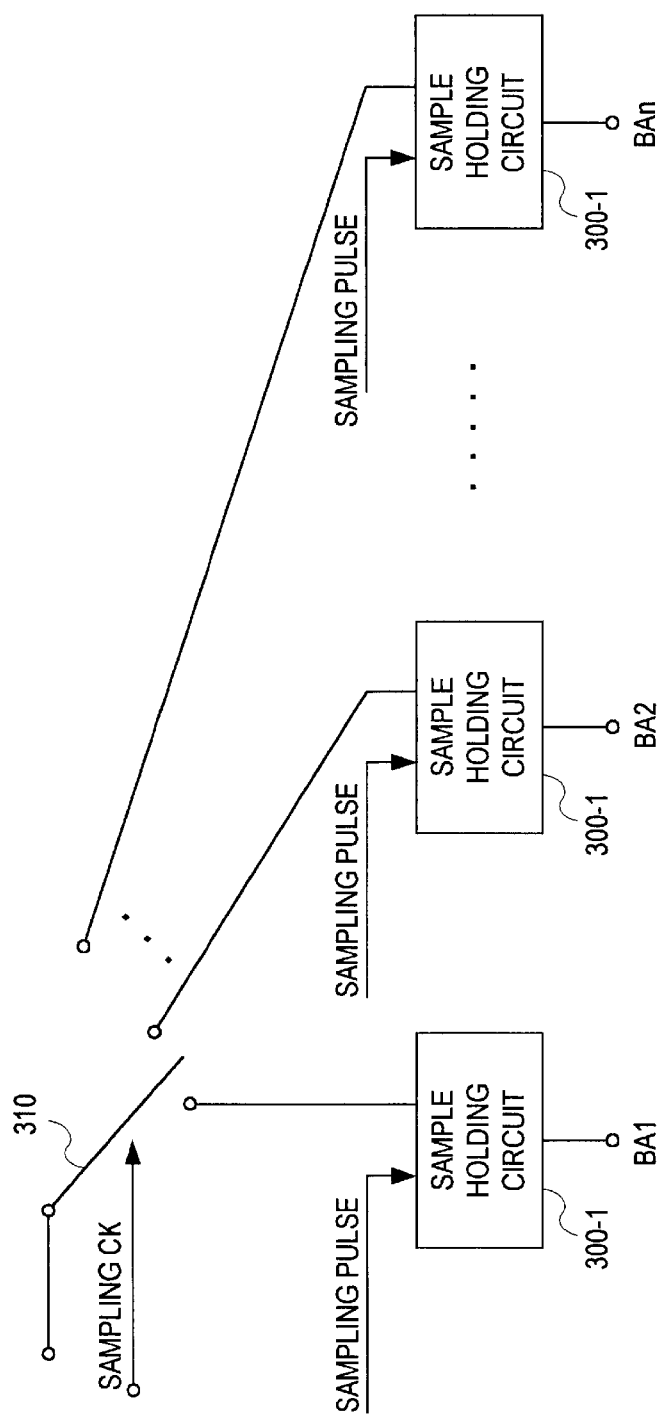
FIG. 4 is a constructional block diagram of an analog sample holding distributing circuit of the transversal filter according to the embodiment of the present invention.

The internal construction of the analog sample holding distributing circuit 30 constructing the transversal filter 20 according to the embodiment of the present invention will now be described with reference to FIG. 4. FIG. 4 is a constructional block diagram of the analog sample holding distributing circuit 30 of the transversal filter 20 according to the embodiment of the present invention.

As shown in FIG. 4, the analog sample holding distributing circuit 30 according to the embodiment of the present invention comprises sample holding circuits 300-1 to 300-n of n stages having the same number as that of sampling values BA1 to BAn constituting one symbol (symbol length n), and a switch 310.

The switch 310 is a switch for distributing the inputted analog reception base band signal S to the sample holding circuits 300-1 to 300-n under a switching control based on a sampling clock (sampling CK) supplied from the timing control unit 60, which will be described herein later.

The sample holding circuits 300 sample the analog signal S distributedly inputted by the switch 310 in accordance with sampling pulses supplied from the timing control unit 60, which will be explained herein later, hold the values, and then outputs the values continuously held until the next analog signal S is inputted as sampling values BA1 to BAn, respectively.

That is, in the operation of the analog sample holding distributing circuit 30, the switch 310 is connected to the sample holding circuit 300-1 of a first stage synchronously with a first sampling CK and the analog input signal S is outputted to the sample holding circuit 300-1 of the first stage. The sample holding circuit 300-1 at the first stage samples the supplied analog signal S in accordance with the sampling pulses supplied from the timing control unit 60, holds the signal as a sampling value BA1, and then outputs it.

The switch 310 is connected to the sample holding circuit 300-2 of a second stage synchronously with a second sampling CK and the analog input signal S is outputted to the sample holding circuit 300-2 of the second stage. The sample holding circuit 300-2 of the second stage samples the inputted signal S in accordance with the sampling pulse supplied from the timing control unit 60, which will be explained herein later, and holds the signal, and then outputs it as a sampling value BA2.

In a manner similar to the above, the analog signals S are distributed to all of the sample holding circuits 300-1 to 300-n by n sampling CKs and are sequentially sampled by the sample holding circuits 300-1 to 300-n. The sampling values BA1 to BAn are held at any time and are outputted to the weighted synthetic circuit 50.

As shown in FIG. 2, the sampling CK and sampling rate fs as a period of the sampling pulse supplied from the timing control unit 60 are controlled by the timing control unit 60 so as to satisfy the equation [sampling rate fs≧2fc (cut-off frequency in the LPF 9)] so that a signal having the maximum reception band width in the plurality of applicable communication systems can be demodulated.

Figure 5:
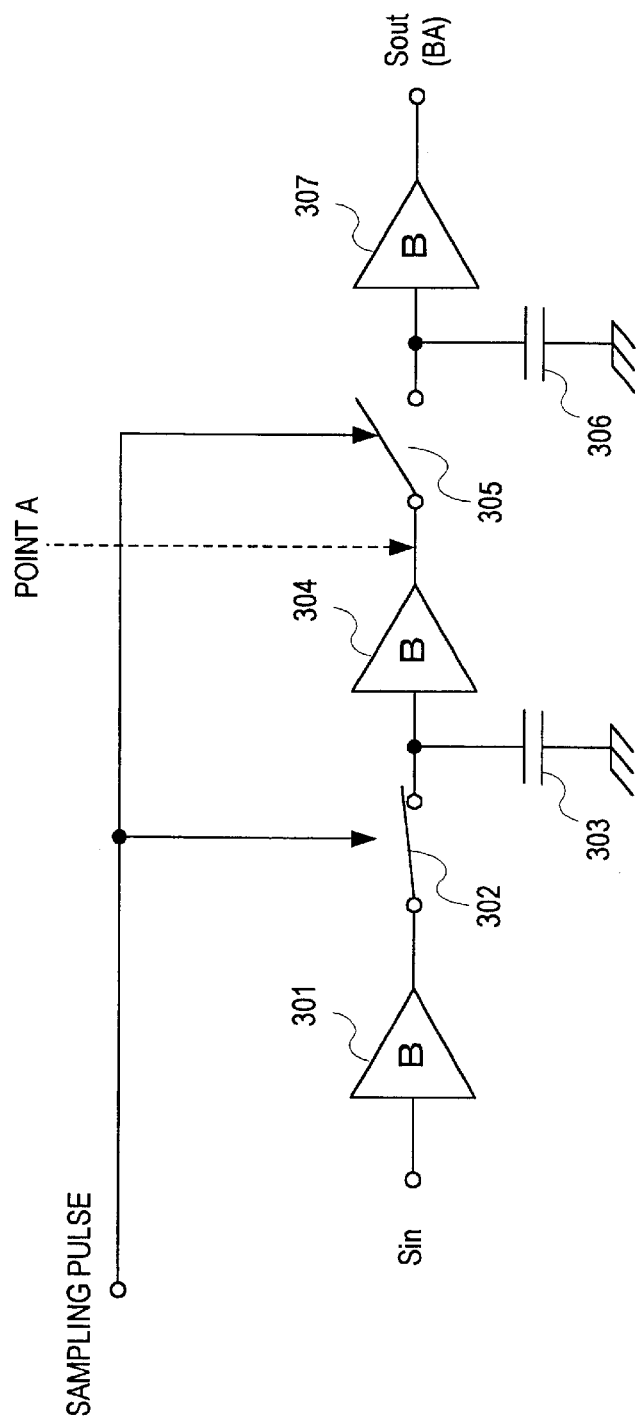
FIG. 5 is a circuit diagram showing an internal constructional example of a sample holding circuit according to the embodiment of the present invention.

The internal construction of the sample holding circuit 300 will now be explained with reference to FIG. 5. FIG. 5 is a circuit diagram showing the internal constructional example of the sample holding circuit 300 according to the embodiment of the present invention.

The one sample holding circuit 300 in the analog sample holding distributing circuit 30 according to the embodiment of the present invention comprises an input buffer 301, a switch 302, a capacitor 303, a buffer 304, a switch 305, a capacitor 306, and a buffer 307.

The switches 302 and 305 are a pair of switches which are connected in series and which perform opening and closing operations so as to be contrary to each other in accordance with the sampling pulses supplied from the timing control unit 60, which will be explained later.

As for the opening and closing operations by the sampling pulse, specifically speaking, when the sampling pulse is low, the switch 302 is turned on and the switch 305 is turned off and, when the sampling pulse is high, the switch 302 is turned off and the switch 305 is turned on.

The capacitors 303 and 306 hold output signals of the switches 302 and 305.

The buffer 301 is a buffer for temporarily holding an inputted signal Sin. The buffers 304 and 307 are buffers for temporarily holding the signals held by the capacitors 303 and 306.

As for the operation of the sample holding circuit 300, at a timing at which the switch 310 is connected and the received signal Sin is inputted, the sampling pulse supplied from the timing control unit 60 is low, the switch 302 is turned on, the switch 305 is turned off, and the received signal Sin is transmitted to the capacitor 303.

Just after that, when the sampling pulse is high, the switch 302 is turned on, and the switch 305 is turned on, the signal level at that time is held in the capacitor 303, and then, the signal (shown by an Point A in the diagram) outputted from the capacitor 303 through the buffer 304 is transmitted to the capacitor 306.

When the sampling pulse is returned to low and the switches 302 and 305 are returned to ON and OFF, the signal level at that time is held by the capacitor 306 and the held signal is continuously outputted as a sampling value BA to the weighted synthetic circuit 50 through the buffer 307 until the next sampling pulse is supplied.

Figure 6:
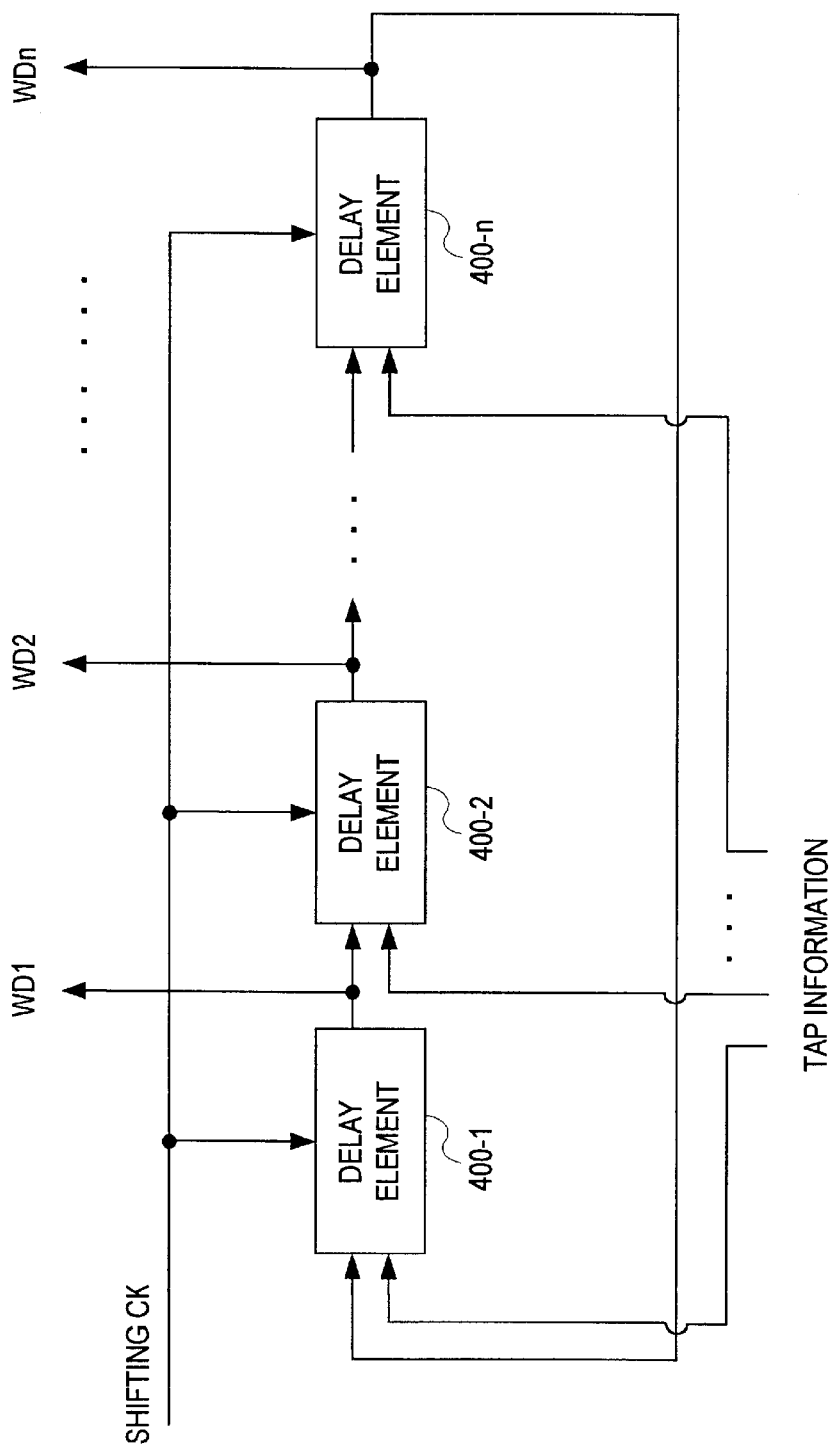
FIG. 6 is a block diagram showing a constructional example of a delay circuit according to the embodiment of the present invention.

The internal construction of the delay circuit 40 constructing the transversal filter 20 according to the embodiment of the present invention will now be explained with reference to FIG. 6. FIG. 6 is a block diagram showing a constructional example of the delay circuit 40 according to the embodiment of the present invention.

The delay circuit 40 according to the embodiment of the present invention comprises delay elements 400-1 to 400-n having the same number as that of tap coefficients WD1 to WDn (symbol length n).

In this instance, it is assumed that the number of taps n is set to the maximum number of taps among the numbers of taps necessary in the plurality of communication systems to which the receiver of the present invention can be applicable to.

Information (tap information) of the tap coefficient having a fixed length of the maximum number of taps n is always outputted from the control unit 13 irrespective of the selected communication system.

In the operation of the delay circuit 40 of the present invention, when new information of the tap coefficient is outputted from the control unit 13, contents held in the delay elements 400-1 to 400-n are simultaneously changed.

After that, as for the information of the tap coefficient held in the delay elements 400-1 to 400-n, while shifting the delay elements one by one in a circulating manner synchronously with a shift CK supplied from the timing control unit 60, the held values are outputted as tap coefficients WD1 to WDn to the weighted synthetic circuit 50.

As for the timing at which new information of the tap coefficient is outputted from the control unit 13, for example, in case of using a long code of the CDMA system, since the tap coefficient changes at a long period, it is necessary to change a code every symbol, so that the output is outputted from the control unit 13 at a period of a symbol length.

In case of using no long code, since the tap coefficient corresponding to the communication system can be supplied only once when the communication system is switched, the output is outputted from the control unit 13 when the communication system is switched.

Figure 7:
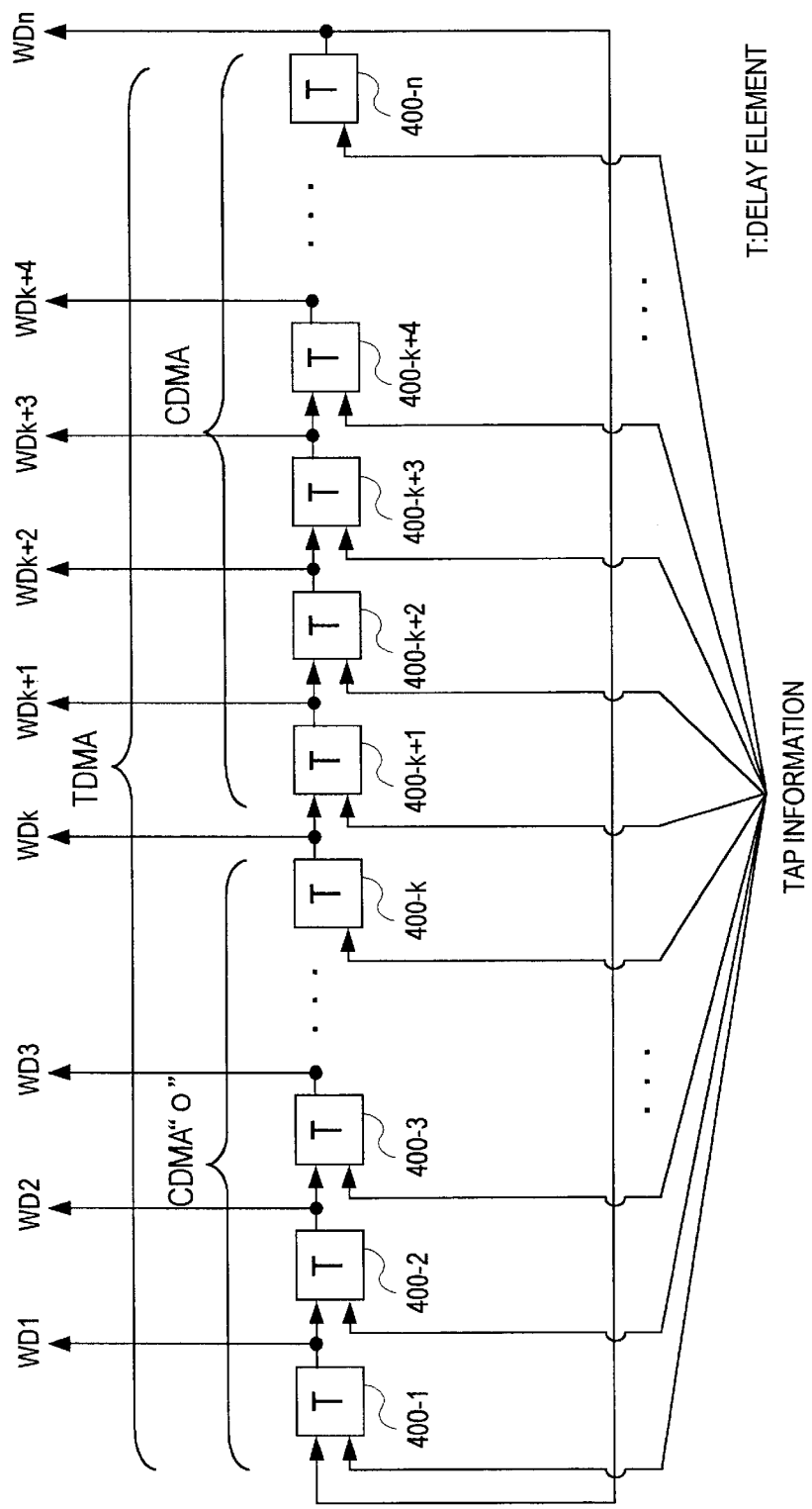
FIG. 7 is an explanatory diagram showing a specific example of a tap coefficient control in the delay circuit according to the embodiment of the present invention.

A specific example of the tap coefficient control in the delay circuit 40 according to the embodiment of the present invention will now be explained with reference to FIG. 7. FIG. 7 is an explanatory diagram showing a specific example of the tap coefficient control in the delay circuit according to the embodiment of the present invention.

As a specific example, when the applicable communication systems are the CDMA and TDMA, the number of taps n is decided so as to suit to the TDMA which needs the more taps and the delay elements (T) 400 are constructed.

When the TDMA is selected, values constituting the tap information to output n tap coefficients from the control unit 13 are set to the delay elements 400-1 to 400-n and the tap coefficients WD1 to WDn are outputted while the delay element is sequentially shifted.

When the CDMA is selected, since the necessary number of taps is smaller than that of the TDMA, in order to make the unnecessary tap coefficients WD1 to WDk invalid, a value "0" of tap information to make invalid is set to the delay elements 400-1 to 400-k by the control unit 13.

The construction of the delay circuit 40 can be applicable to the selected communication system by performing the above process without changing the construction so as to suit to the number of taps.

The internal construction of the weighted synthetic circuit 50 will now be explained with reference to FIG. 6.

Figure 8:
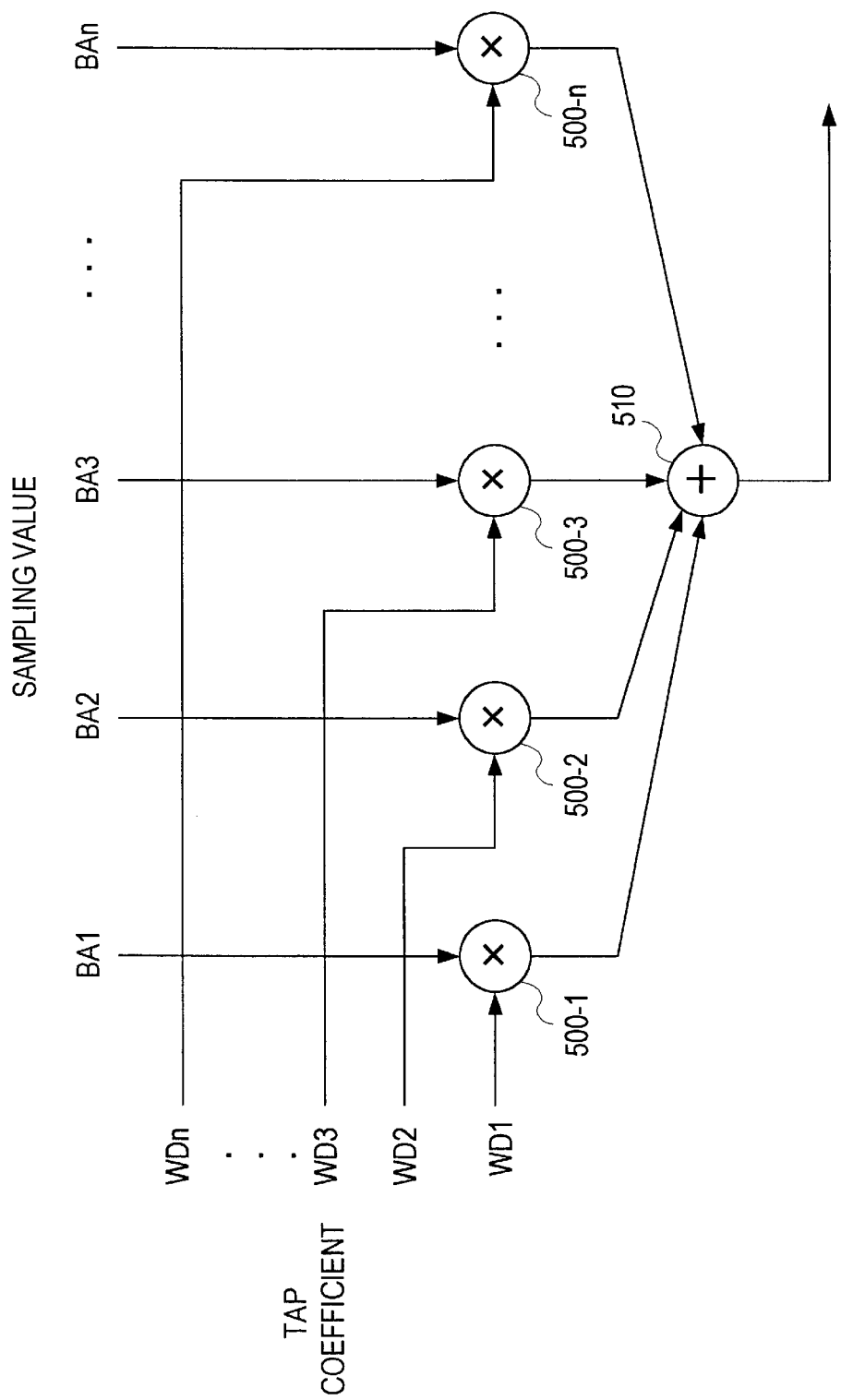
FIG. 8 is a block diagram showing a constructional example of a weighted synthetic circuit in the transversal filter according to the embodiment of the present invention.

FIG. 8 is a block diagram showing a constructional example of the weighted synthetic circuit 50 in the transversal filter 20 according to the embodiment of the present invention.

The weighted synthetic circuit 50 of the present invention comprises n (symbol length) multiplying circuits 500-1 to 500-n for weighting and an adding circuit 510 for synthesizing outputs from the multiplying circuits 500-1 to 500-n.

In the weighted synthetic circuit 50, the sampling values BA1 to BAn from the analog sample holding distributing circuit 30 and tap coefficients WD1 to WDn from the delay circuit 40 are inputted, the sampling values BA1 to BAn are weighted by the tap coefficients WD1 to WDn by executing multiplying processes in the multiplying circuits 500-1 to 500-n, outputs from the multiplying circuits 500-1 to 500-n are added to synthesize by the adding circuit 510, and the resultant value is outputted.

Figure 9:
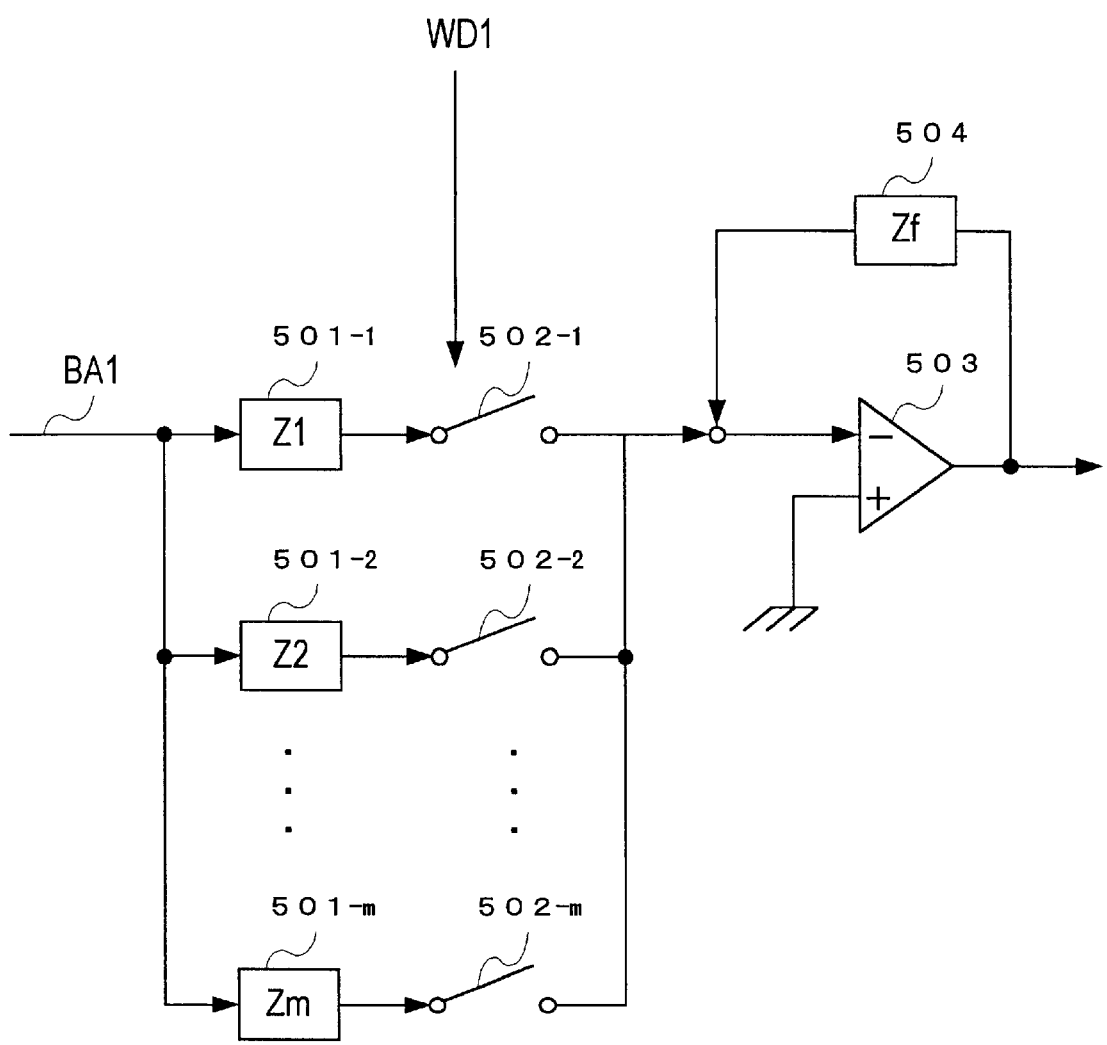
FIG. 9 is a block diagram showing an internal constructional example of one of multiplying circuits consisting the weighted synthetic circuit according to the embodiment of the present invention.

The internal construction of the multiplying circuit 500 will now be described with reference to FIG. 9. FIG. 9 is a block diagram showing an internal constructional example of one of the multiplying circuits 500 constituting the weighted synthetic circuit 50 according to the embodiment of the present invention and shows an example of the case of the multiplying circuit 500-1.

As shown in FIG. 9, the internal portion of one of the multiplying circuits 500 constituting the weighted synthetic circuit 50 according to the embodiment of the present invention comprises m impedances (Z1) 501-1 to (Zm) 501-m corresponding to a precision (the number of component bits) of tap coefficients, switches 502-1 to 502-m each of which makes a pair with each impedance, an amplifier 503, and a feedback impedance (Zf) 504.

In this instance, each impedance $Z_i$ ($i=1, 2, \ldots, m$) is constructed by a capacitor. The impedance $Z_i$ has a value shown in [Equation 1] by a capacitance $C_i$ ($i=1, 2, \ldots, m$) of the capacitor. As a value of the capacitance $C_i$ is closer to the most significant bit (MSB) of the input BA, it is set to larger.

$$Z_i = 1/(j\omega C_i) \qquad \text{Equation 1}$$

Values of bits constructing the tap coefficients WD consisting of m bits inputted from the delay circuit 40 are inputted to the switches 502-1 to 502-m and the opening/closing operations of the switches are controlled by the values.

The feedback impedance 504 is a feedback impedance for an output of the amplifier 503. The impedance Zf is constructed by a capacitor. The impedance Zf is shown in [Equation 2] by a capacitance Cf of the capacitor.

$$Z_f = 1/(j\omega C_f) \qquad \text{Equation 2}$$

A gain G of the multiplying circuit 500 is expressed by the capacitance $C_i$ ($i=1, 2, \ldots, m$) of the capacitor constructing the impedance $Z_i$ ($i=1, 2, \ldots, m$) and the capacitance Cf of the capacitor constructing the feedback impedance Zf in [Equation 3].

$$G = \Sigma_i C_i / C_f \qquad \text{Equation 3}$$

In the operation of the multiplying circuit 500 according to the embodiment of the present invention, the sampling value BA1 inputted to the multiplying circuit 500-1 is dividedly inputted to the impedances 501-1 to 501-m in order to weight m bits to the value, the tap coefficient WD1 consisting of m bits is inputted to the multiplying circuit 500, and values of the bits constituting the tap coefficient WD1 are inputted to the switches 502-1 to 502-m.

The switches 502-1 to 502-m are opened or closed in accordance with the values of bits of the tap coefficient WD, the total sum value of the impedance Zi (i=1, 2, . . . , m) is outputted, the value is fed back and amplified by the amplifier 503 and feedback impedance 504, and the resultant value is outputted.

The timing control unit 60 performs clock supply and switching control of the switches in the transversal filter 20. Specifically speaking, the unit supplies the sampling CK to switch the switch 310 of the analog sample holding distributing circuit 30 and supplies the sampling pulses to control the switching timing of the switches 302 and 305 of the sample holding circuit 300.

As shown in FIG. 2, the sampling rate fs as a period of the sampling CK and sampling pulse supplied to the transversal filter 20 by the timing control unit 60 is controlled to satisfy the equation of [sampling rate $fs \geq 2fc$ (cut-off frequency in the LPF 9)] so that the signal having the maximum reception band width in the plurality of applicable communication systems can be demodulated.

The timing control unit 60 always supplies shifting clocks to the delay elements 500-1 to 500-n and allows to output the tap information stored in the delay elements 500-1 to 500-n while shifting the elements in a circulating manner.

Figure 10:
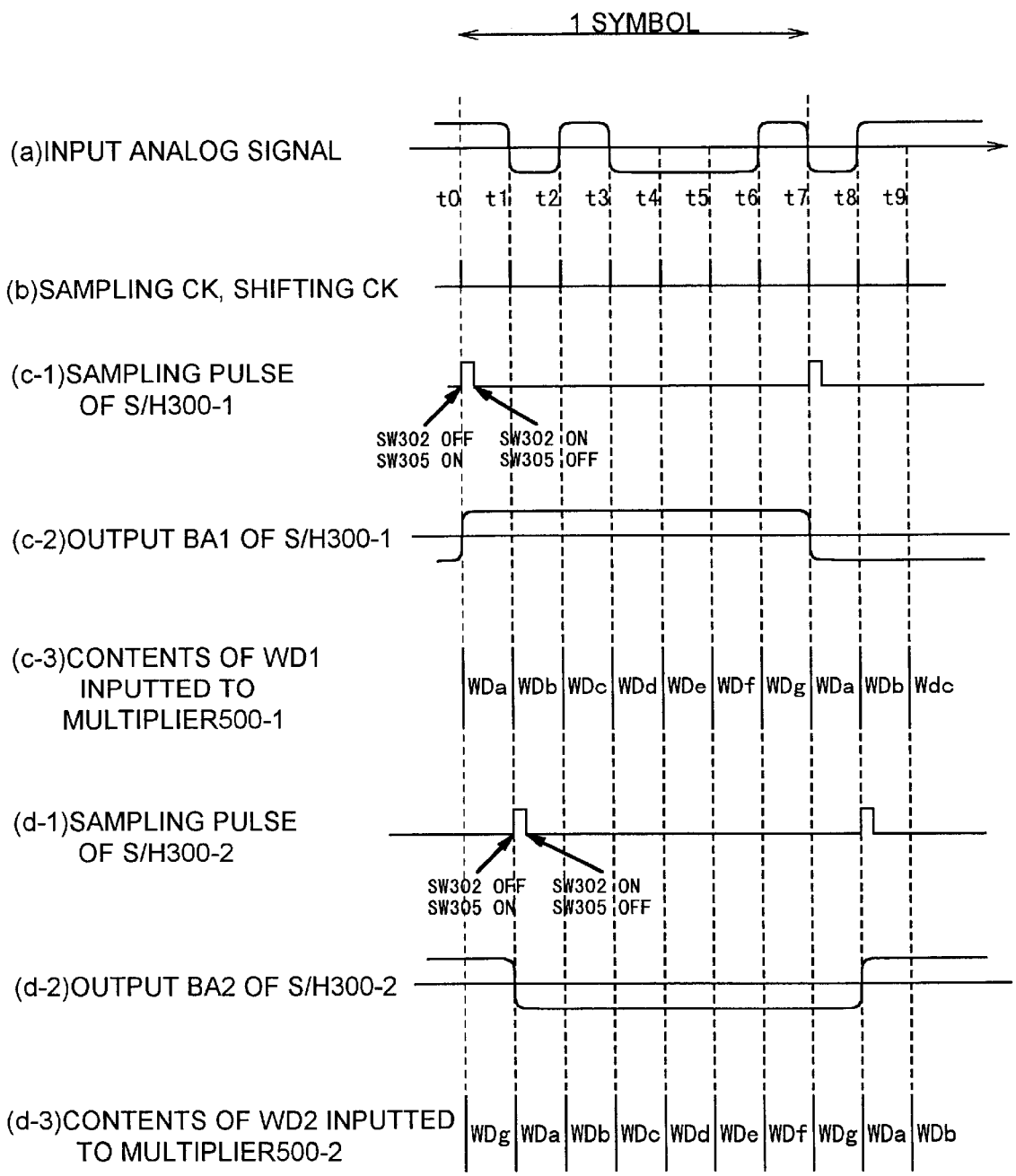
FIG. 10 is a timing chart showing the operations of various clocks and sections in the transversal filter according to the embodiment of the present invention.

Various clocks supplied from the timing control unit 60 and the operations of the sections in the transversal filter 20 will now be described by using a specific example in FIG. 10. FIG. 10 is a timing chart showing various clocks and the operations of the sections in the transversal filter 20 according to the embodiment of the present invention. FIG. 10 shows a case where the symbol length n is equal to 7.

For example, when the input analog signal S is shown in FIG. 10(*a*) and time t0 to t7 correspond to one symbol, the sampling CK supplied to the analog sample holding distributing circuit 30 and shifting CK supplied to the delay circuit 40 from the timing control unit 60 are always supplied as shown in FIG. 10. The switch 310 is connected to the sample holding circuit 300-1 by the sampling CK at time t0 and the signal S from time t0 to time t1 is inputted to the sample holding circuit 300-1.

At this time, the sampling pulse supplied from the timing control unit 60 to the sample holding circuit 300-1 is shown in FIG. 10(*c*-1) and rises so as to correspond to time t0. At that time, the switch 302 is turned off and the switch 305 is turned on. Due to trailing of the sampling pulse, the switches 302 and 305 are returned and the sampling and holding are performed. The output BA1 from the sample holding circuit 300-1 is held up to the next sampling pulse (time t7) as shown in FIG. 10(*c*-2).

For the period of time, the shifting CK shown in FIG. 10(*b*) is supplied to the delay circuit 40. The tap coefficient WD1 outputted from the delay element 400-1 is shifted in a circulating manner, for example, it is switched to WDa, WDb, . . . , WDg, WDa, . . . and is outputted to the multiplying circuit 500-1 and the sum of products is arithmetically operated.

Similarly, the switch 310 is connected to the sample holding circuit 300-2 by the sampling CK of time t1 and the signal S from the time t1 to t2 is inputted to the sample holding circuit 300-2. The sampling pulse supplied from the timing control unit 60 to the sample-hole circuit 300-2 is shown in FIG. 10(*d*-1) and raises for a specific period so as to correspond to time t1. The sampling and holding are performed by the opening and closing operations of the switches 302 and 305 at that time. The output BA2 from the sample holding circuit 300-2 is held up to the next sampling pulse (time t8) as shown in FIG. 10(*d*-2).

For the period of time, the tap coefficient WD2 outputted from the delay element 400-2 is shifted in a circulating manner by the shifting CK, for example, it is switched to WDa, WDb, . . . , WDg, WDa, . . . and the coefficient is outputted to the multiplying circuit 500-2, thereby operating the sum of products.

The operation of the receiver according to the embodiment of the present invention will now be described with reference to FIG. 1.

In the receiver according to the embodiment of the invention, in accordance with the communication system arbitrarily selected from among the plurality of applicable communication systems, the frequency control signal to designate the same local frequency as a carrier frequency which is used in the communication system is outputted to the variable oscillator 21 by the control unit 13. In the variable oscillator 21, a signal having the designated frequency is oscillated to the mixer 8.

Information (digital signals) of the tap coefficient based on the communication system is outputted from the control unit 13 to the transversal filter 20. The demodulating unit control signal to designate a demodulation system based on the selected communication system is outputted from the control unit 13 to the demodulating unit 12.

A received signal received by the antenna 1 is amplified by the gain variable LNA 2 gain-controlled by the AGC control unit 6 so as to stabilize an output level from the LPF 9 at the post stage and is down-converted to a base band frequency band by a signal of the same local frequency as a carrier frequency used in the designated communication system in the mixer 8.

Figure 11:
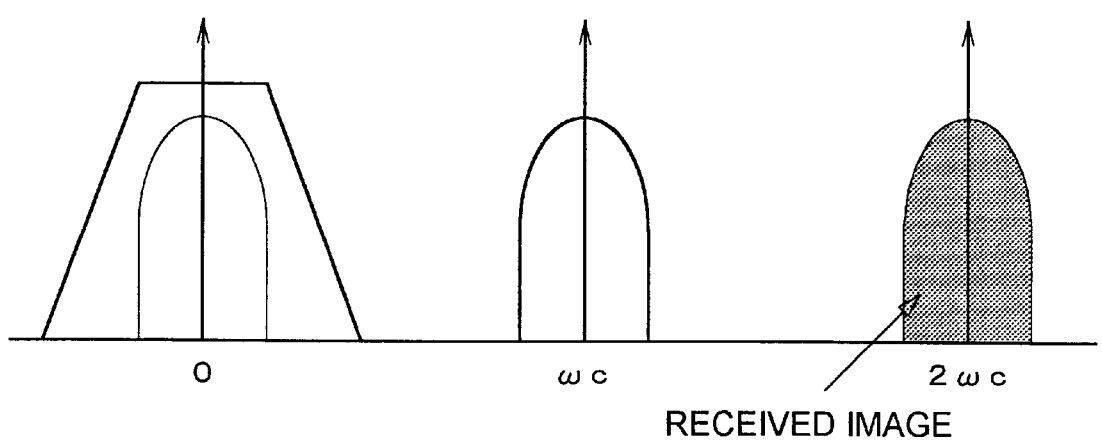
FIG. 11 is an explanatory diagram showing characteristics of a direct conversion system.

As for the construction, what is called a direct conversion system is constructed. As shown in FIG. 11, since no received image frequency occurs near a desired frequency, it is well known that the band limitation can be easily performed by the LPF 9 having the wide pass band through which subsequent signals of all of the communication systems can pass.

FIG. 11 is an explanatory diagram showing characteristics of the direct conversion system.

The received signal whose frequency is converted to the base band frequency band is limited in the wide band through which signals of all of the corresponding communication systems in the LPF 9. An output of the LPF 9 is inputted to the AGC control unit 6 and transversal filter 20.

The AGC control unit 6 controls the gain of the gain variable LNA 2 so that the received signal level in the output from the LPF 9 is set to constant.

Although a construction in which the AGC control unit 6 is arranged before the LPF 9 is considered, in this case, signals of all bands are inputted to the AGC control unit 6, so that the passing output level in the LPF 9 cannot be set constant. In order to set a desired frequency signal to a predetermined level, a construction to control by using the output signal from the transversal filter 20 is also considered. In this case, however, there is a possibility that when the desired frequency signal is a narrow band signal, the gain variable LNA 2 is saturated. According to the construction of the present invention, those problems are avoided.

The analog received signals each of whose band is limited by the LPF 9 are sampled and held by the sample holding circuits 300 of the analog sample holding distributing circuit 30 of the transversal filter 20 so as to deviate the timing, outputted as sampling values (BA1 to BAn), weighted with the tap coefficients (WD1 to WDn) which are formed by the delay circuit 40 of the transversal filter 20 in accordance with the tap information designated by the control unit 13 and are outputted while shifting in a circulating manner for synthesis by the weighted synthetic circuit 50, outputted as demodulation signals, and demodulated in the demodulating unit 12 by the demodulation system based on the communication system designated from the control unit 13, and the resultant signal is outputted.

Figure 12:
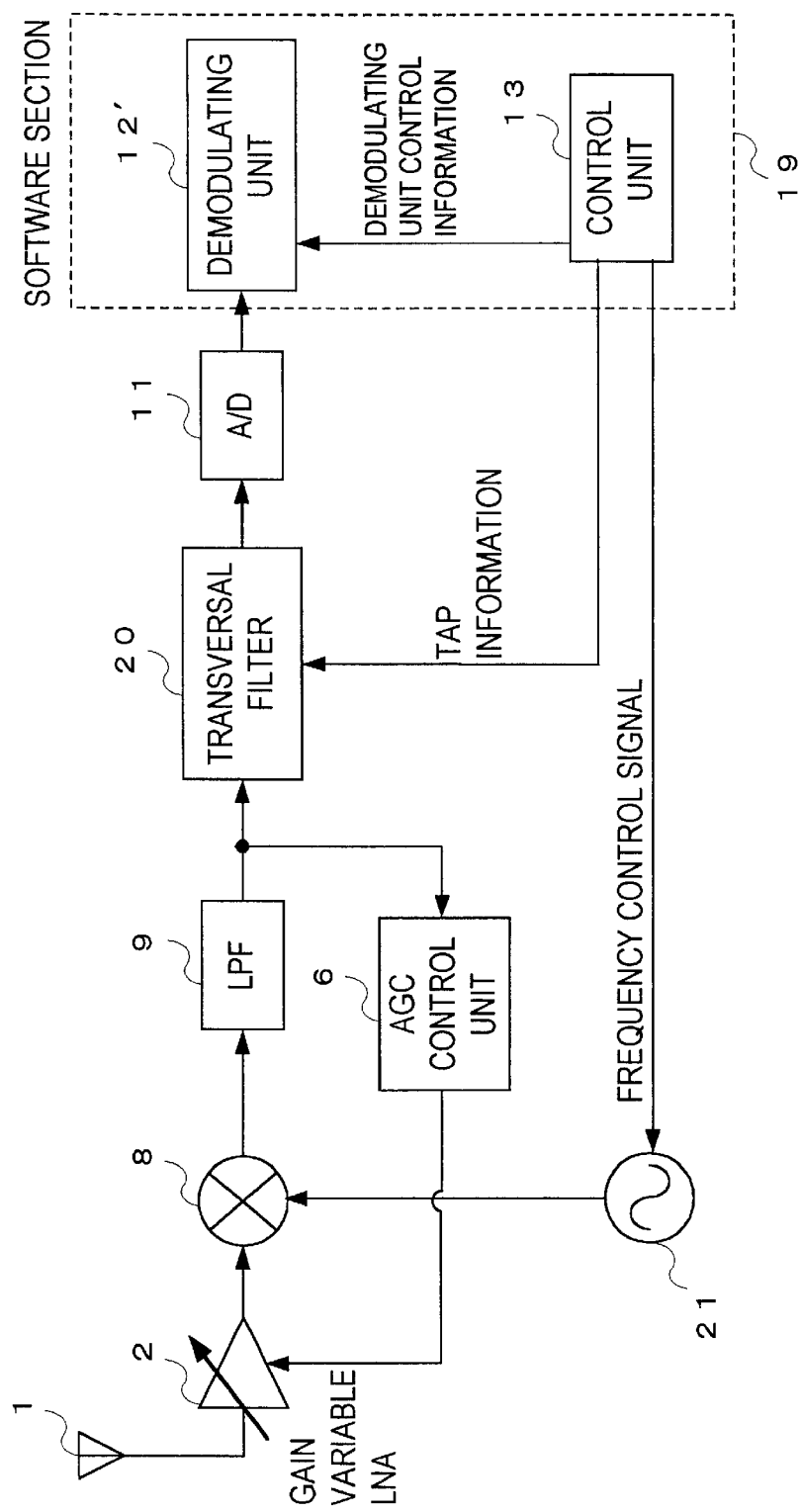
FIG. 12 is a block diagram showing a second constructional example of the receiver according to the embodiment of the present invention.
Figure 13:
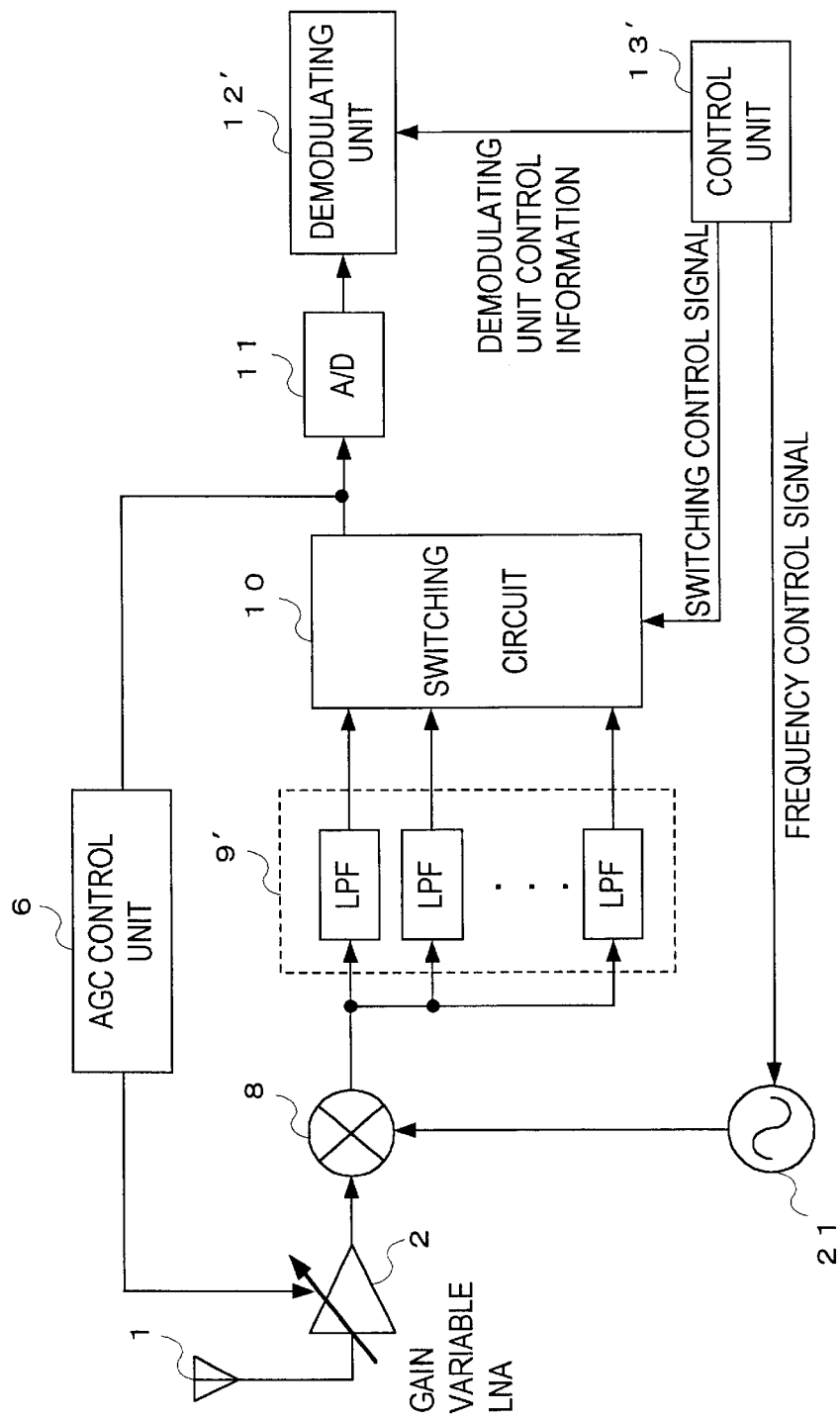
FIG. 13 is a constructional block diagram of a conventional receiver.

A second constructional example (second receiver) of the receiver according to the embodiment of the present invention will now be explained with reference to FIG. 12. FIG. 12 is a block diagram showing the second constructional example of the receiver according to the embodiment of the present invention. The component elements having substantially the same constructions as those in FIGS. 1 and 13 are described by adding the same reference numerals.

The second receiver of the present invention comprises the antenna 1, gain variable LNA 2, AGC control unit 6, mixer 8, LPF 9, transversal filter 20, demodulating unit 12', and control unit 13 as the same component elements as those of the present receiver (first receiver) described above by using FIG. 1 and further has an A/D converter 11 as a characteristics portion of the second receiver.

The functions of the demodulating unit 12' and control unit 13 are realized by software and are set to a software section 19 comprising a DSP (digital signal processor) and a CPU (central processing unit). Therefore, the demodulation systems corresponding to the communication systems are described in accumulation programs (software) by the above DSP and CPU.

Accordingly, as for the operation of the second receiver, in a manner similar to that of the first receiver, the received signal received by the antenna 1 is amplified by the gain variable LNA 2, the frequency band of the amplified signal is down-converted to the base band frequency band by the mixer 8 by the same local frequency as a carrier frequency used in the designated communication system, the band of the resultant signal is limited by the LPF 9, and the resultant signal is inputted to the transversal filter 20.

In a manner similar to the first receiver, the signal is sampled and held in the transversal filter 20 and the band of the signal is limited by weighting with the tap coefficient based on the communication system designated from the control unit 13 for synthesis. The resultant signal is converted from an analog signal to a digital signal by the A/D converter 11 as a characteristics portion of the second receiver and the converted signal is demodulated in the demodulating unit 12' in the software section 19 by the demodulation system based on the selected communication system and the resultant signal is outputted.

According to the first and second receivers according to the embodiment of the present invention, since the variable oscillator 21 for oscillating the local frequency based on the selected communication system is provided and the direct conversion system for converting the received signal to the base band signal at the local frequency oscillated by the variable oscillator 21 is used, there is such an effect that an adverse influence due to a fact that a received image frequency occurs can be avoided.

According to the first and second receivers according to the embodiment of the present invention, since the band of the down-converted base band signal is limited by the LPF 9 having the pass band width suited to the system having the maximum band among all of the applicable communication systems and the band limitation is performed in the transversal filter 20 by weighting with the tap coefficient based on the communication system for synthesis, it is unnecessary in the receiver to individually provide the LPF 9 every corresponding communication system, so that there is such an effect that a circuit scale can be remarkably reduced as compared with the conventional system to intend the miniaturization of a device.

According to the present invention, since the receiver which can be applicable to a plurality of communication systems and which receives a signal by the communication system arbitrarily selected from among the communication systems comprises the converting means for converting a received signal to a base band signal by a local oscillation frequency based on the selected communication system, setting means for setting peculiar tap coefficient based on the selected communication system, synthesizing means for weighting the base band signal with the set tap coefficient to synthesize them, and demodulating means for demodulating the signal synthesized by weighting by the demodulation system based on the selected communication system, it can be applicable to the plurality of communication systems without having a band filter every communication system, so that there is an effect that a circuit scale can be reduced.

According to the present invention, since the receiver which can be applicable to a plurality of communication systems and which receives a signal by the communication system arbitrarily selected from among the plurality of communication systems comprises the variable oscillator for oscillating a local oscillation frequency based on the selected communication system, mixer for converting a received signal to a base band signal by the local oscillation frequency, transversal filter for setting a tap coefficient from the information of tap coefficient inputted from the outside based on the selected communication system, weighting the base band signal with the tap coefficient to synthesize them, and performing a band limitation based on the communication system to the signal, and demodulating unit for demodulating a signal by a demodulation system based on the selected communication system, it can be applicable to the plurality of communication systems without having the band filter every communication system, so that there is such an effect that a circuit scale can be reduced.

According to the present invention, since the receiver which can be applicable to a plurality communication systems and which receives a signal by the communication system arbitrarily selected from among the plurality of communication systems comprises the receiving antenna, gain variable LNA for amplifying a signal from the receiving antenna by a gain control signal inputted from the outside, mixer for converting the frequency of an output of the gain variable LNA to a base band frequency band by a signal of a local frequency inputted from the outside, variable oscillator for supplying a signal of the designated local frequency from the outside to the mixer, LPF having a band through which a signal having the widest band among the plurality of communication systems can pass, for limiting the band of the signal whose frequency is converted by the mixer, AGC control unit for deciding the gain of the gain variable LNA from an output of the LPF and outputting a gain control signal to the gain variable LNA, transversal filter for setting a tap coefficient from the information of tap coefficient inputted from the outside on the basis of the selected communication system and weighting the output of the LPF with the tap coefficient to synthesize them, thereby performing the band limitation suited to a demodulation system based on the communication system, demodulating unit for receiving the signal which is outputted from the transversal filter and whose band is limited and for performing demodulation based on the selected communication system, and control unit for designating the local frequency of the variable oscillator on the basis of the selected communication system, outputting information of the tap coefficient of a fixed length that is equal to the maximum number of taps in the plurality of communication systems to the transversal filter in order to enable to be applicable to all of the communication systems, and designating the demodulation system to the demodulating unit, it can be applicable to the plurality of communication systems without having a band filter every communication system, so that there is such an effect that a circuit scale can be reduced.

According to the present invention, since the receiver has the A/D converter for converting the output from the transversal filter to digital signals and the program section for realizing the functions of the demodulating unit and the control unit by using software in place of those unit and can be applicable to the plurality of communication systems without providing the band filter every communication system, there is such an effect that a circuit scale can be reduced.

What is claimed is:

1. A receiver which can be applicable to a outside plurality of communication systems and which receives a signal by the communication system arbitrarily selected from among said plurality of communication systems, comprising:

converting means for converting a received signal to a base band signal by a local oscillation frequency based on said selected communication system;

setting means for setting peculiar tap coefficients based on said selected communication system;

synthesizing means for weighting said base band signal with said set tap coefficients to synthesize the base signal and the tap coefficients;

demodulating means for demodulating said signal synthesized by weighting by a demodulation system based on said selected communication system, wherein said converting means has a variable oscillator for oscillating a designated local frequency and a mixer for converting the received signal to the base band signal by a local oscillation frequency from said variable oscillator, said setting means and said synthesizing means have a transversal filter for setting a tap coefficient from information of tap coefficient inputted from the outside based communication systems on information of the designated communication system, inputting said base band signal, and weighting the signal with said tap coefficient to synthesize them, and said demodulating means has a demodulating unit for demodulating an output from said transversal filter by said communication system based on the information of the designated communication system.

2. A receiver which can be applicable to a plurality of communication systems and which receives a signal by the communication system arbitrarily selected from among said plurality of communication systems, comprising:

a variable oscillator for oscillating a local oscillation frequency based on said selected outside communication system;

a mixer for converting a received signal to a base band signal by said local oscillation frequency;

a transversal filter for setting a tap coefficient from information of tap coefficient inputted from the outside based on said selected communication system, and weighting said base band signal with said tap coefficient to synthesize the, base band signal and the tap coefficients thereby performing a band limitation based on the communication system; and a demodulating unit for demodulating the signal by a demodulation system based on said selected communication system.

3. The receiver according to claim 2, further having a band limitation filter, which has a band among the plurality of communication system, for limiting a band of the signal frequency converted by said mixer and outputting the resultant signal to said transversal filter.

4. The receiver according to claim 1, further having a band limitation filter, which has a band through which a signal having the widest band among the plurality of communication system, for limiting a band of the signal frequency converted by said mixer and outputting the resultant signal to said transversal filter.

5. A receiver which can be applicable to a plurality of outside communication systems and which receives a signal by the communication system arbitrarily selected from among said plurality of communication systems, comprising:

a receiving antenna;

a gain variable LNA for amplifying a signal from said receiving antenna by a gain control signal inputted from the outside communication systems;

a mixer for converting a frequency of an output of said gain variable LNA to a base band frequency band by using a signal having a local frequency inputted from the outside communication systems;

a variable oscillator for supplying a signal having the local frequency designated from the outside communication systems to said mixer;

an LPF, which has a band through which a signal having the widest band among said plurality of communication systems can pass, for limiting a band of the signal that is frequency converted by said mixer;

an AGC control unit for deciding a gain of said gain variable LNA from the output of said LPF and outputting a gain control signal to said gain variable LNA;

a transversal filter for setting a tap coefficient from information of the tap coefficient inputted from the outside communication systems on the basis of the selected communication system and performing a band limitation suitable to a modulation system based on said communication system by weighting the output of said LPF with said tap coefficient for synthesis;

a demodulating unit for receiving the band-limited signal outputted from said transversal filter and performing demodulation based on the selected communication system to the signal; and a control unit for designating a local frequency of said variable oscillator on the basis of the selected communication system, outputting information of the tap coefficient having a fixed length that is equal to the maximum number of taps in said plurality of communication systems to said transversal filter so as to enable to be applicable to all of the plurality of communication systems, and designating a demodulation system to said demodulating unit.

6. The receiver according to claim 5, wherein said transversal filter comprises:

sample holding means for sampling outputs of said LPF and holding a plurality of sampling values;

delay means for subsequently shifting information of tap coefficient supplied from the outside to hold it and for outputting said held information as a tap coefficient while shifting the information;

synthesizing means for obtaining the sum of products obtained by multiplying the tap coefficients outputted from said delay means by sampling values outputted from said sample holding means and then outputting the sum; and timing control means for performing timing control in said sample holding means and said delay means.

7. The receiver according to claim 6, wherein said sample holding means of said transversal filter is means having sample holding circuits of the same number as that of predetermined sampling values and a first switch for sequentially sorting the outputs from said LPF to said sample holding circuit, and each of said sample holding circuits is a sample holding circuit which comprises a pair of second and third switches which are connected in series and which perform opening and closing operations for a clock signal so as to be contrary to each other, a capacitor for holding output signals of said switches, and a buffer for temporarily holding an input signal and signals held by said capacitor and which samples analog signals sorted and supplied by said first switch by the switching operations of said second and third switches, holds, and then outputs the signals.

8. The receiver according to claim 6, wherein said delay means of said transversal filter has serially connected delay elements of the same number as that of the sampling value, said delay element holds information of the inputted tap coefficient, and said delay means for simultaneously outputting digital values held in said delay elements as tap coefficients synchronously with a clock timing while shifting each value by an amount as much as one delay element.

9. The receiver according to claim 6, wherein said synthesizing means of said transversal filter is synthesizing means having multiplying circuits of the same number as that of sampling values and an adding circuit for adding outputs from said multiplying circuits, and said multiplying circuit is a multiplying circuit having impedances which are connected in parallel and to which the inputted sampling value is dividedly supplied, switches each of which is connected to each of said impedances in series and which opens or closes by a value of each bit constructing the inputted tap coefficient, an amplifier to which outputs from said switches are supplied, and a feedback impedance for feeding back an output of said amplifier.

10. The receiver according to claim 5, further having an A/D converter for converting an output from said transversal filter to a digital signal and a program section for realizing functions of said demodulating unit and said control unit by using software in place of the units.

* * * * *

UNITED STATES PATENT AND TRADEMARK OFFICE
CERTIFICATE OF CORRECTION

PATENT NO.    : 6,366,765 B1
DATED         : April 2, 2002
INVENTOR(S)   : Hongo et al.

It is certified that error appears in the above-identified patent and that said Letters Patent is hereby corrected as shown below:

<u>Title page,</u>
Item [73], Assignee, please add the following second Assignee:
-- Yozan Inc., Tokyo, Japan --.

Signed and Sealed this

First Day of July, 2003

JAMES E. ROGAN
*Director of the United States Patent and Trademark Office*